United States Patent [19]
Nash

[11] 3,872,390
[45] Mar. 18, 1975

[54] CMOS OPERATIONAL AMPLIFIER WITH INTERNAL EMITTER FOLLOWER

[75] Inventor: Harold Garth Nash, Tempe, Ariz.

[73] Assignee: Motorola, Inc., Chicago, Ill.

[22] Filed: Dec. 26, 1973

[21] Appl. No.: 427,752

[52] U.S. Cl. ........................ 330/13, 330/28, 330/35
[51] Int. Cl. ............................................ H03f 3/18
[58] Field of Search ......... 330/13, 28, 32, 38 M, 35; 307/205, 214

[56] References Cited

UNITED STATES PATENTS

| | | | |
|---|---|---|---|
| 3,449,683 | 6/1969 | Gane | 330/28 X |
| 3,537,023 | 10/1970 | Meyer | 330/28 X |
| 3,636,372 | 1/1972 | Hujita et al. | 307/251 |
| 3,772,607 | 11/1973 | Luckett et al. | 307/205 X |

*Primary Examiner*—James B. Mullins
*Attorney, Agent, or Firm*—Vincent J. Rauner; Charles R. Hoffman

[57] ABSTRACT

A bipolar transistor is provided on a CMOS semiconductor chip in combination with an emitter follower resistor, A CMOS inverter, an input resistor and a feedback resistor. The bipolar transistor and the emitter follower resistor are connected to form an emitter follower, which has its input connected to the output of the CMOS inverter. A high resistance feedback resistor is connected between the output of the emitter follower and the input of the CMOS inverter. A high value input resistor is connected between the input conductor of the operational amplifier and the input of the CMOS inverter.

6 Claims, 1 Drawing Figure

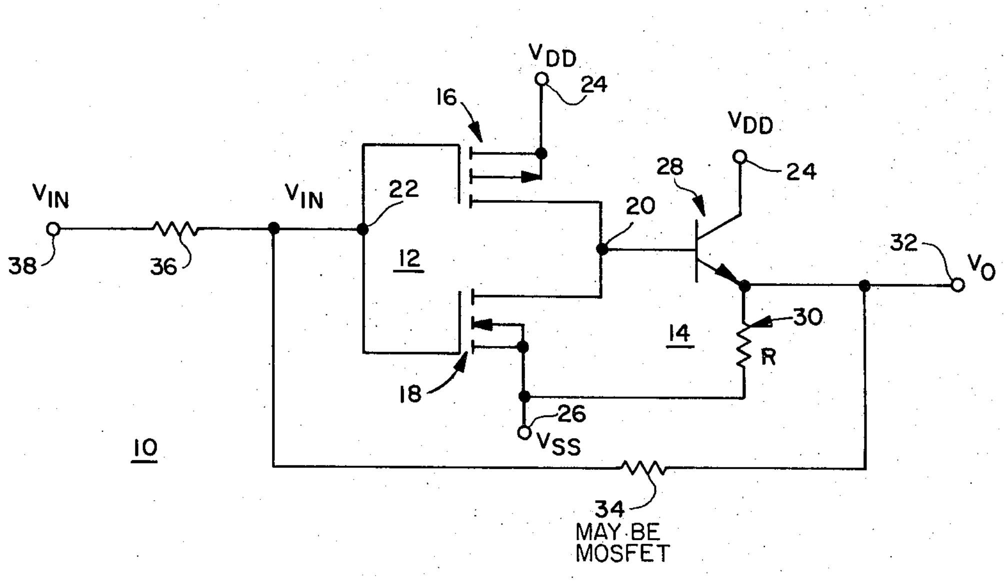
VDD
24
16
VDD
28
24
VIN
VIN
22
20
32
VO
38
36
12
30
14
R
18
26
VSS
10
34
MAY BE
MOSFET

CMOS OPERATIONAL AMPLIFIER WITH INTERNAL EMITTER FOLLOWER

BACKGROUND OF THE INVENTION

There are numerous applications where operational amplifiers may be useful in CMOS systems. CMOS systems, to date, have been mainly digital systems. The complexity of functions achievable on a single semiconductor chip has increased greatly in recent years, and it has become advantageous in some cases to combine analog and digital circuit functions on a single semiconductor chip. However, this has not been practical to date in most instances, because of the relatively low gain of MOS transistors. For example, to implement a CMOS operational amplifier having low output impedance, a relatively very large source follower MOSFET must be provided, which causes the operational amplifier to have poor frequency response because of the high capacitance of the source follower MOSFET and high cost because of the large amount of chip area required. Although MOS transitors serve well to implement digital functions, analog functions are usually most readily and economically implementable with bipolar transistors. Unfortunately, the technologies for producing bipolar integrated circuits and CMOS integrated circuits have been relatively incompatible.

SUMMARY OF THE INVENTION

It is an object of the invention to provide an operational amplifier having relatively low output impedance and being compatible with CMOS technology.

It is another object of the invention to provide a CMOS operational amplifier having a bipolar transistor in the output portion thereof.

It is another object of the invention to provide an integrated circuit CMOS operational amplifier including a bipolar emitter follower output circuit and a CMOS inverter gain circuit.

Briefly described, the invention provides a CMOS operational amplifier including a CMOS inverter having its output coupled to an input of a bipolar transistor output circuit. The output of the output circuit is coupled by a very high resistance feedback resistor to the input of the CMOS inverter. A second very high resistance input resistor is coupled in series with the input of the CMOS inverter. The emitter resistor of the emitter follower may be provided on the chip or off the chip, depending on the magnitude of resistance and the accuracy desired.

BRIEF DESCRIPTION OF THE DRAWING

The sole drawing is a schematic diagram of a CMOS operational amplifier according to the invention.

DESCRIPTION OF THE INVENTION

FIG. 1 shows a schematic diagram of an embodiment of the CMOS operational amplifier according to the invention. CMOS operational amplifier 10 includes CMOS inverter 12 and bipolar emitter follower 14. CMOS inverter 12 includes P-channel MOSFET 16 which has its source electrode connected to $V_{DD}$ supply conductor 24, its gate electrode connected to node 22, and its drain electrode connected to node 20. CMOS inverter 12 also includes N-channel MOSFET 18 which has its source electrode connected to $V_{SS}$ conductor 26, its gate connected to node 22 and its drain connected to node 20. Node 22, the input of CMOS inverter 12, is connected to one terminal of resistor 36, the other terminal of which is connected to input conductor 38, to which an input signal $V_{IN}$ may be applied. Emitter follower 14 includes bipolar NPN transistor 28 which has its collector connected to $V_{DD}$ conductor 24, its base connected to node 20, and its emitter connected to node 32, the output conductor. The emitter of transistor 28 is connected to one terminal of resistor 30, the other terminal of which is connected to $V_{SS}$ conductor 26. Node 32 is connected to one terminal of feedback resistor 34, the other terminal of which is connected to node 22.

The output impedance of the CMOS inverter alone would typically range from 1,000 ohms to 5,000 ohms. By providing a bipolar transistor requiring an area of only 15 square mils, a substantially lower output impedance can be achieved in the circuit configuration of the FIGURE than if a MOSFET source follower four or five times as large were utilized. Further, the MOSFET would have a very high gate-to-source capacitance as compared to the emitter-to-base capacitance of the bipolar device.

The input resistor 36 and the feedback resistor 34 can be provided using so-called "tub" resistors utilizing the relatively high resistivity P-type material utilized for making the "tubs" in conventional CMOS processing. Transistor 28 can be implemented on a CMOS chip in the form of a vertical NPN transitor in which the same P-type material utilized to form the tub regions is used as the base of that transistor and the N-type substrate is the collector. The input and feedback resistors may be provided on the chip as MOSFETS biased in their triode regions to provide high resistance resistors. It is not necessary that the devices be physically very large, as is usually required to achieve high tolerance, because the closed loop gain of the amplifier is a function of the resistor ratios, and not of their absolute magnitude.

The operational amplifier of FIG. 1 provides a number of desirable features, which include lower output impedance than previously achievable in integrated circuits manufactured using current CMOS technology. A much smaller chip size, as well as improved performance is achieved over that which would be obtainable using only MOSFET devices.

In summary, the invention provides a CMOS operational amplifier capable of providing low output impedance and high current drive capability by providing a bipolar emitter follower including a vertical NPN transistor formed in a P-type "tub"-type region on a CMOS semiconductor chip.

While the invention has been described in relation to a particular embodiment thereof, those skilled in the art will recognize that variations in connections and placement of parts to satisfy various requirements may be made within the scope of the invention.

What is claimed is:

1. An integrated circuit operational amplifier comprising:

a non-switching CMOS gain circuit;

an output circuit including a bipolar transistor having its base connected to an output of said CMOS gain circuit and having its emitter connected to an output of said integrated circuit operational amplifier for providing low output impedance; and, bias means coupled to said output of said integrated circuit operational amplifier and to an input of said non-switching CMOS gain circuit for biasing said non-switching CMOS gain circuit to provide gain for said integrated circuit operational amplifier proportional to a ratio of resistors of said bias circuit means, said bias circuit means including a first resistor connected between an input of said integrated circuit operational amplifier and said input of said non-switching CMOS gain circuit and a feedback resistor connected between said output of said integrated operational amplifier and said input of said non-switching CMOS gain circuit.

2. A CMOS integrated circuit operational amplifier on a semiconductor chip comprising;

non-switching CMOS amplifier means including a first MOSFET of a first cnductivity type and a second MOSFET of a second conductivity type, said first MOSFET having its source coupled to a first voltage conductor, a gate coupled to a gate of said second MOSFET, and a drain coupled to a drain of said second MOSFET, said second MOSFET having a source coupled to a second voltage conductor;

an emitter follower including a bipolar transistor having a collector coupled to said first voltage conductor, a base coupled to said drains of said first and second MOSFETS an emitter coupled to emitter current source means; and, bias circuit means including an input resistor coupled between an input of said CMOS integrated circuit operational amplifier and said gates of said first and second MOSFETs and a feedback resistor connected between said emitter and said gates of said first and second MOSFET's for biasing said non-switching amplifier means at a bias point establishing the gain of said operational amplifier substantially equal to the ratio between said input resistor and said feedback resistor.

3. The CMOS operational amplifier as recited in claim 2 wherein said first MOSFET is P-channel and said second MOSFET is N-channel, and said bipolar transistor is a vertical NPN transistor formed in a tub type region.

4. The CMOS operational amplifier as recited in claim 2 wherein said emitter current source is a resistor.

5. The CMOS operational amplifier as recited in claim 2 wherein said feedback resistor is a resistor formed from a tub type region.

6. A CMOS operational amplifier as recited in claim 2 wherein said feedback resistor is a MOSFET biased as a resistor.

* * * * *